(12) United States Patent
Guo (10) Patent No.: US 12,014,994 B2
(45) Date of Patent: Jun. 18, 2024

(54) METHOD FOR FORMING OVERLAY MARKS AND SEMICONDUCTOR STRUCTURE

(71) Applicant: CHANGXIN MEMORY TECHNOLOGIES, INC., Anhui (CN)

(72) Inventor: Shuai Guo, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 386 days.

(21) Appl. No.: 17/598,864

(22) PCT Filed: Jun. 24, 2021

(86) PCT No.: PCT/CN2021/101941
§ 371 (c)(1),
(2) Date: Sep. 27, 2021

(87) PCT Pub. No.: WO2022/179010
PCT Pub. Date: Sep. 1, 2022

(65) Prior Publication Data
US 2023/0223349 A1    Jul. 13, 2023

(30) Foreign Application Priority Data
Feb. 25, 2021  (CN) .......................... 202110209604.7

(51) Int. Cl.
*H01L 23/544* (2006.01)
*H01L 21/033* (2006.01)
*H01L 21/311* (2006.01)

(52) U.S. Cl.
CPC ........ *H01L 23/544* (2013.01); *H01L 21/0332* (2013.01); *H01L 21/31144* (2013.01); *H01L 2223/54426* (2013.01)

(58) Field of Classification Search
CPC .............. H01L 23/544; H01L 21/0332; H01L 21/31144; H01L 2223/54426; H01L 21/68; G03F 7/70683; G03F 7/70633
See application file for complete search history.

(56) References Cited

U.S. PATENT DOCUMENTS 6,083,807 A * 7/2000 Hsu ....................... H01L 23/544
257/E23.179
2008/0305636 A1  12/2008 Kim et al.
(Continued)

FOREIGN PATENT DOCUMENTS

CN      111463171 A      7/2020
CN      111968962 A     11/2020
(Continued)

OTHER PUBLICATIONS

International Search Report in Application No. PCT/CN2021/101941, mailed on Nov. 24, 2021.

*Primary Examiner* — Jonathan Han
(74) *Attorney, Agent, or Firm* — Syncoda LLC; Feng Ma (57) ABSTRACT

The method for forming overlay marks includes: providing a substrate, a surface of the substrate having a mark layer and a first mask layer; forming first trenches and second trenches in the first mask layer; forming a spacer layer covering side walls of the first trenches and side walls of the second trenches; backfilling the first trenches and the second trenches; removing the spacer layer; and etching the mark layer and forming main overlay marks and dummy overlay marks.

14 Claims, 7 Drawing Sheets

(56) References Cited

U.S. PATENT DOCUMENTS

2016/0307850 A1* 10/2016 Lin ..................... G03F 7/70633
2017/0148643 A1* 5/2017 Ham ................... H01L 21/3086
2019/0259708 A1* 8/2019 Tang ..................... G03F 9/7076

FOREIGN PATENT DOCUMENTS

| CN | 113013076 A | | 6/2021 |
|----|-------------|---|--------|
| KR | 20050096633 A | * | 10/2005 |
| KR | 20050096633 A | | 10/2005 |
| KR | 20100042423 A | * | 4/2010 |
| KR | 20100042423 A | | 4/2010 |

* cited by examiner

METHOD FOR FORMING OVERLAY MARKS AND SEMICONDUCTOR STRUCTURE

CROSS-REFERENCE TO RELATED APPLICATIONS

This application is a national stage of International Application No. PCT/CN2021/101941 filed on Jun. 24, 2021, which claims priority to Chinese Patent Application No. 202110209604.7 filed on Feb. 25, 2021 The disclosures of these applications are hereby incorporated by reference in their entirety.

TECHNICAL FIELD

The present application relates to the field of semiconductor manufacturing technology, and in particular, to a method for forming overlay marks and a semiconductor structure.

BACKGROUND

Overlay marks are patterns used to measure the alignment precision between different layers in the semiconductor manufacturing process, and are used to determine whether the alignment precision between upper and lower layers meets the requirements of the process. When the process line width of a semiconductor structure is relatively wide, the process for manufacturing overlay marks is relatively simple.

With the development of the semiconductor industry, in order to increase corporate profits and chip integration, the line width of the process is increasingly narrow, which then increases the data volume of a chip formed on a wafer. However, as the line width continues to decrease, more and more problems arise. The problems of overlay marks for measuring the alignment precision between different layers in the manufacturing process are increasingly prominent. Therefore, how to reduce the influence of the structure density effect on overlay mark patterns so that the required overlay mark patterns can be accurately formed to improve the alignment precision between different layers is a technical problem urgently to be solved at present.

SUMMARY

The present application provides a method for forming overlay marks and a semiconductor structure, which are used to solve the problem the prior art that the required overlay marks cannot be accurately formed due to the structure density effect, so as to ensure smooth progress of a semiconductor manufacturing process.

In order to solve the above problems, the present application provides a method for forming overlay marks, including:

providing a substrate, a surface of the substrate having a mark layer and a first mask layer, the first mask layer covering a surface of the mark layer, the mark layer including a first mark region and second mark regions at ends of the first mark region;

patterning the first mask layer to form a first pattern region and second pattern regions in the first mask layer, the second pattern regions being at ends of the first pattern region, the first pattern region having a plurality of first trenches, the second pattern region having a plurality of second trenches, the first mark region corresponding to the first pattern region, the second mark regions corresponding to the second pattern regions;

forming a spacer layer covering at least side walls of the first trenches and side walls of the second trenches;

backfilling the first trenches and the second trenches to form a second mask layer;

removing the spacer layer to form etching windows between the first mask layer and the second mask layer; and etching the mark layer along the etching windows, and forming main overlay marks in the first mark region and dummy overlay marks in the second mark regions.

In some embodiments, the step of forming a spacer layer at least covering side walls of the first trenches and side walls of the second trenches includes:

depositing a spacer material to form the spacer layer covering the side walls and bottom wall of the first trenches, the side walls and bottom wall of the second trenches, and a top surface of the first mask layer.

In an exemplary embodiment of the present application, the step of forming a second mask layer includes:

backfilling the first trenches and the second trenches to form the second mask layer, wherein, the second mask layer fills the first trenches and the second trenches and covers the spacer layer on the top surface of the first mask layer, and a thickness of the second mask layer in the first pattern region is less than a thickness of the second mask layer in the second pattern regions.

In an exemplary embodiment of the present application, the second mark regions are distributed around the periphery of the first mark region; and the second pattern regions are distributed around the periphery of the first pattern region.

In an exemplary embodiment of the present application, the main overlay marks are bar patterns extending in a first direction, a plurality of main overlay marks are arranged in parallel along a second direction perpendicular to the first direction, and both the first direction and the second direction are parallel to the substrate; and the dummy overlay marks are frame patterns surrounding the first mark region, and a plurality of dummy overlay marks are sequentially nested along a direction of the first mark region to the second mark regions.

In an exemplary embodiment of the present application, the main overlay marks are bar patterns extending in a first direction, a plurality of main overlay marks are arranged in parallel along a second direction perpendicular to the first direction, and both the first direction and the second direction are parallel to the substrate; and the dummy overlay marks include first dummy patterns and second dummy patterns, a plurality of first dummy patterns are located at two opposite ends of the main overlay marks in the second direction and extend in the first direction, and a plurality of second dummy patterns are located at two opposite ends of the main overlay marks in the first direction and extend in the second direction.

In an exemplary embodiment of the present application, the main overlay marks are bar patterns extending in a first direction, a plurality of main overlay marks are arranged in parallel along a second direction perpendicular to the first direction, and both the first direction and the second direction are parallel to the substrate; and the dummy overlay marks include a plurality of third dummy patterns, and the plurality of third dummy patterns are arranged in a frame shape around the periphery of the first mark region.

In an exemplary embodiment of the present application, a feature size of the dummy overlay marks is less than or equal to a feature size of the main overlay marks.

In order to solve the above problems, the present application further provides a semiconductor structure, including:
  a substrate; and
  a mark layer located on the substrate and including a first mark region and second mark regions, the second mark regions being at ends of the first mark region, the first mark region having main overlay marks, the second mark regions having dummy overlay marks.

In an exemplary embodiment of the present application, the second mark regions are distributed around the periphery of the first mark region.

In an exemplary embodiment of the present application, the main overlay marks are bar patterns extending in a first direction, a plurality of main overlay marks are arranged in parallel along a second direction perpendicular to the first direction, and both the first direction and the second direction are parallel to the substrate; and
  the dummy overlay marks are frame patterns surrounding the first mark region, and a plurality of dummy overlay marks are sequentially nested along a direction of the first mark region to the second mark regions.

In an exemplary embodiment of the present application, the main overlay marks are bar patterns extending in a first direction, a plurality of main overlay marks are arranged in parallel along a second direction perpendicular to the first direction, and both the first direction and the second direction are parallel to the substrate; and
  the dummy overlay marks include first dummy patterns and second dummy patterns, a plurality of first dummy patterns are located at two opposite ends of the main overlay marks in the second direction and extend in the first direction, and a plurality of second dummy patterns are located at two opposite ends of the main overlay marks in the first direction and extend in the second direction.

In an exemplary embodiment of the present application, the main overlay marks are bar patterns extending in a first direction, a plurality of main overlay marks are arranged in parallel along a second direction perpendicular to the first direction, and both the first direction and the second direction are parallel to the substrate; and
  the dummy overlay marks include a plurality of third dummy patterns, and the plurality of third dummy patterns are arranged in a frame shape around the periphery of the first mark region.

In an exemplary embodiment of the present application, the main overlay marks penetrate the mark layer; and
  the dummy overlay marks penetrate or do not penetrate the mark layer.

In an exemplary embodiment of the present application, in a direction of the first mark region to the second mark regions, a width of the second mark regions is less than a width of the first mark region.

According to the method for forming overlay marks and the semiconductor structure provided by the present application, a mark layer for forming overlay marks is divided into a first mark region and second mark regions at ends of the first mark region, main overlay marks are formed in the first mark region, and dummy overlay marks are formed in the second mark regions, so that the height difference of the second mask layer due to the structure density effect during the formation of overlay marks is pulled outward to improve the evenness of the thickness of the second mask layer filled in the first mark region, thereby ensuring that intact main overlay marks completely penetrating the mark layer are formed in the mark layer, and ensuring smooth progress of the semiconductor manufacturing process.

DETAILED DESCRIPTION

At present, Spin On Carbon (SOC) is used in the manufacturing process as a hard mask layer for forming overlay marks. The reason is the SOC has good fluidity and therefore has good filling capability. However, in the actual semiconductor manufacturing process, the fluidity of SOC is not so perfect, and is affected by a pattern structure density, that is, a structure density effect or a pattern loading effect. The filling height of SOC is lower at a position with a higher pattern structure density, and correspondingly, the filling height of SOC is higher at a position with a lower pattern structure density. Therefore, there is a height difference between the SOC filled in the center of a pattern structure and the SOC filled at the edge of the pattern structure, for example, the SOC filled in the center of the pattern structure is lower than the SOC filled at the edge of the pattern structure. The unevenness of the SOC filling height will affect smooth progress of the subsequent process, for example, it will cause insufficient etching at the edge of the pattern structure during subsequent photolithography, to affect the performance of the final product structure, and even to scrap a wafer, thus increasing the semiconductor manufacturing cost.

In order to solve the above problems, the present application provides a method for forming overlay marks and a semiconductor structure, which are used to solve the problem the prior art that the required overlay marks cannot be accurately formed due to the structure density effect, so as to ensure smooth progress of a semiconductor manufacturing process and improve product yield. The following describes specific embodiments of the method for forming overlay marks and a semiconductor structure according to the present application in detail with reference to the accompanying drawings.

Figure 1:
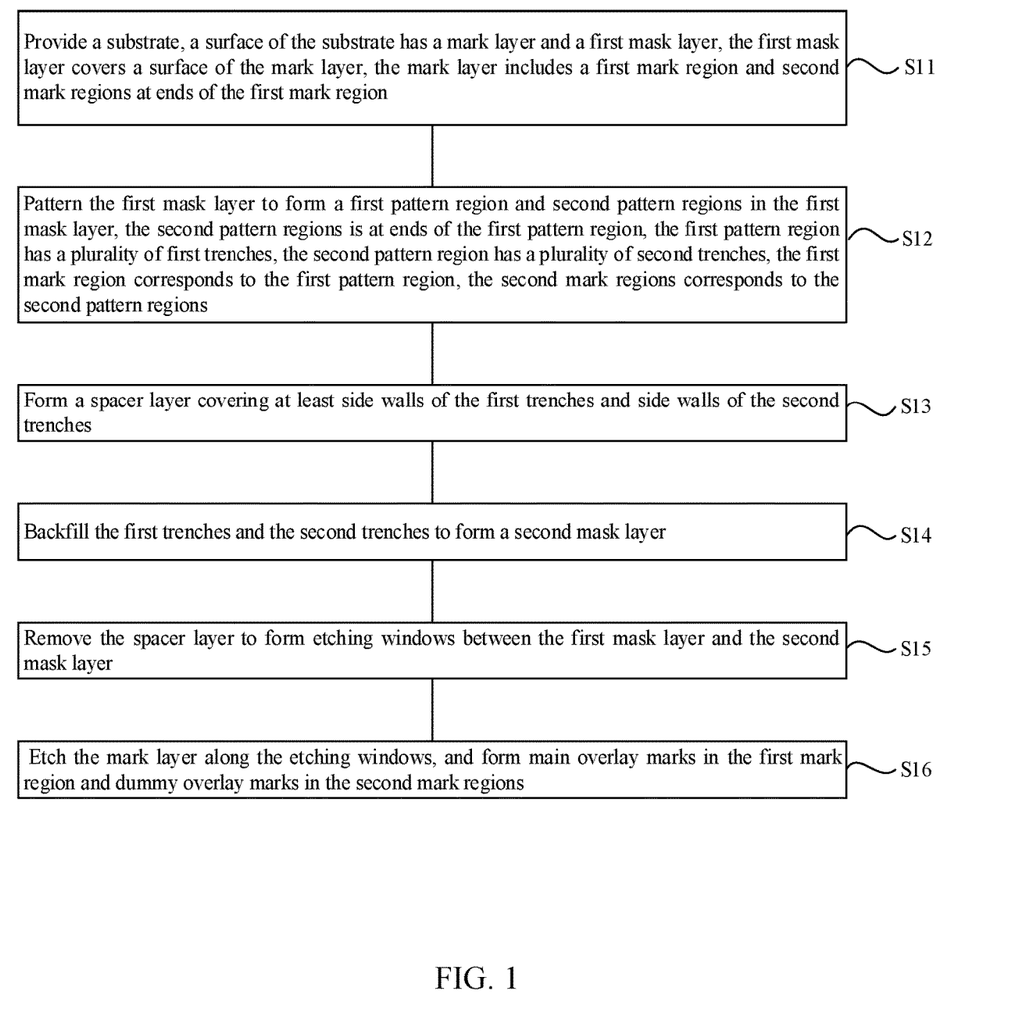
FIG. 1 is a flowchart of a method for forming overlay marks according to a specific embodiment of the present application.
Figure 2A:
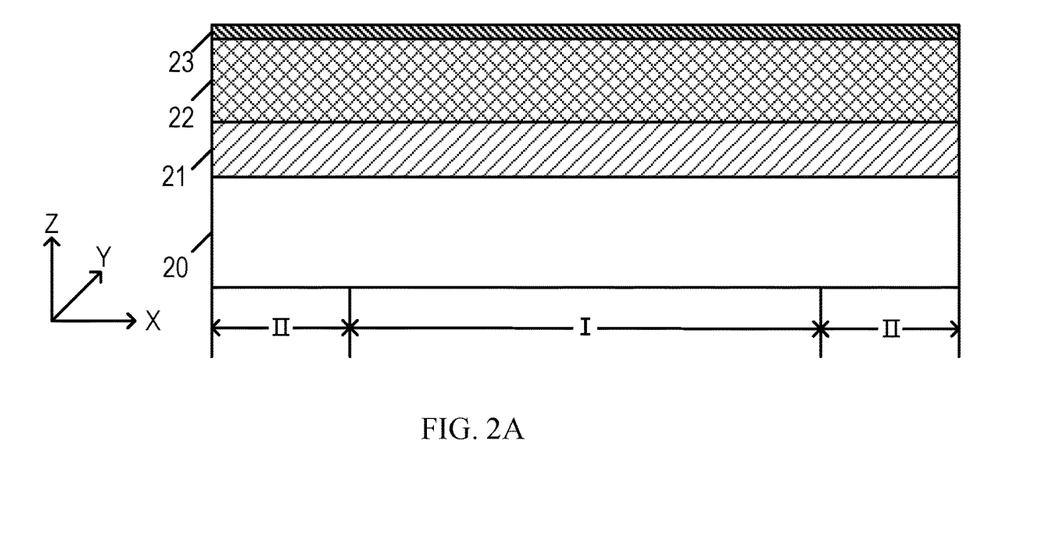
FIG. 2A is a first schematic diagram of main process sections during the formation of overlay marks according to specific embodiments of the present application.

This embodiment provides a method for forming overlay marks. FIG. 1 is a flowchart of a method for forming overlay marks according to a specific embodiment of the present application, and FIGS. 2A-2J are schematic diagrams of main process sections during the formation of overlay marks according to specific embodiments of the present application. As shown in FIGS. 1 and 2A-2J, the method for forming overlay marks in this embodiment includes the following steps:

Step S11, a substrate 20 is provided, a surface of the substrate 20 has a mark layer 21 and a first mask layer 22, and the first mask layer 22 covers a surface of the mark layer 21, the mark layer 21 includes a first mark region I and second mark regions II at ends of the first mark region I, as shown in FIG. 2A.

Specifically, the substrate 20 may be a single silicon substrate, or a substrate formed by stacking a plurality of films. The mark layer 21 is subsequently used to form overlay marks. The material of the first mask layer 22 may be a hard mask material, such as an organic carbon material. The first mark region I is used to form main overlay marks, and the second mark regions II are used to form dummy overlay marks. In a semiconductor manufacturing process, the main overlay marks are used for overlay alignment. The width of the second mark regions II may be set by those skilled in the art according to actual requirements, for example, the width may be 0.5 μm to 10 μm.

Figure 2B:
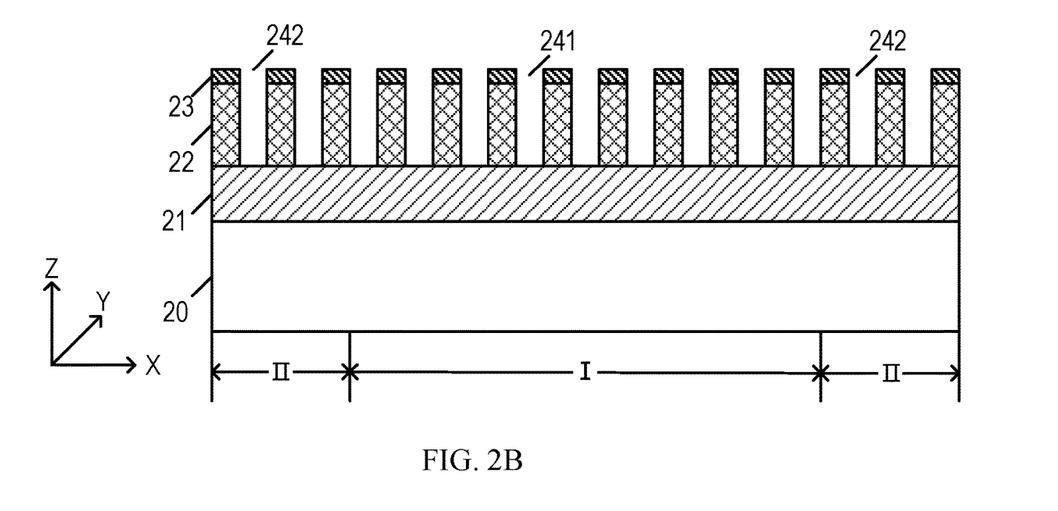
FIG. 2B is a second schematic diagram of main process sections during the formation of overlay marks according to specific embodiments of the present application.

Step S12, the first mask layer 22 is patterned to form a first pattern region and second pattern regions in the first mask layer 22, the second pattern regions is at ends of the first pattern region, the first pattern region has a plurality of first trenches 241, the second pattern region has a plurality of second trenches 242, the first mark region I corresponds to the first pattern region, the second mark regions II correspond to the second pattern regions, as shown in FIG. 2B.

Specifically, before the first mask layer 22 is patterned, an auxiliary mask layer 23 may also be formed on the surface of the first mask layer 22 to ensure the morphology of patterns formed in the first mask layer 22. The material of the auxiliary mask layer 23 is different from the material of the first mask layer 22 to facilitate subsequent selective etching. The material of the auxiliary mask layer 23 may be, but is not limited to, a nitride material. Afterwards, the auxiliary mask layer 23 and the first mask layer 22 are etched to form the plurality of first trenches 241 in the first pattern region corresponding to the first mark region I and form the plurality of second trenches 242 in the second pattern regions corresponding to the second mark regions II. Both the first trenches 241 and the second trenches 242 penetrate the auxiliary mask layer 23 and the first mask layer 22 in a direction perpendicular to the substrate 20 (for example, a Z-axis direction in FIG. 2B). The plurality mentioned in this specific embodiment refers to two or more.

Figure 2C:
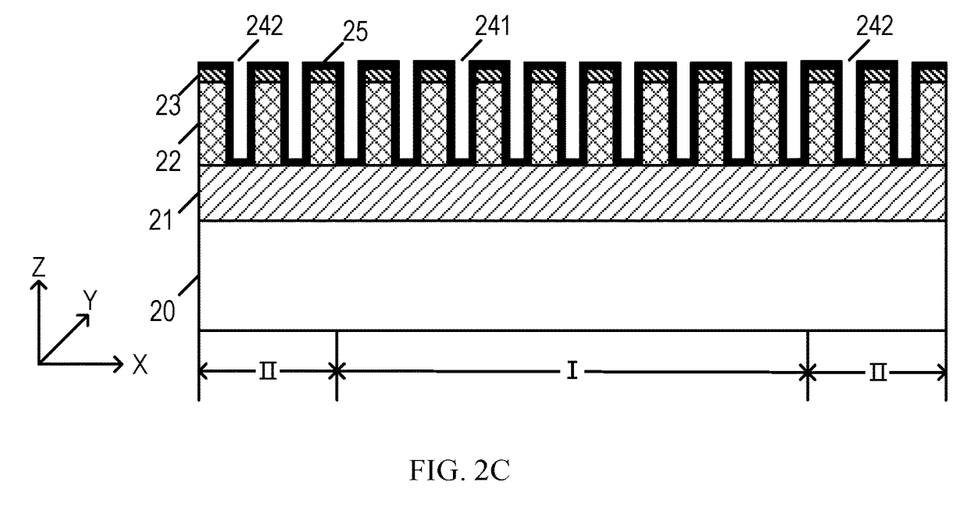
FIG. 2C is a third schematic diagram of main process sections during the formation of overlay marks according to specific embodiments of the present application.

Step S13, a spacer layer 25 covering at least side walls of the first trenches 241 and side walls of the second trenches 242 is formed, as shown in FIG. 2C.

In an exemplary embodiment of the present application, the step of forming a spacer layer 25 covering at least side walls of the first trenches 241 and side walls of the second trenches 242 includes:

a spacer material is deposited to form the spacer layer 25 covering the side walls and bottom wall of the first trenches 241, the side walls and bottom wall of the second trenches 242, and a top surface of the first mask layer 22.

Specifically, after the first trenches 241 and the second trenches 242 are formed, the spacer material is deposited by atomic layer deposition or other deposition process to form the spacer layer 25 covering the side walls and bottom wall of the first trenches 241, the side walls and bottom wall of the second trenches 242, and the top surface of the auxiliary mask layer 23 (that is, the surface of the auxiliary mask layer 23 facing away from the substrate 20). The spacer layer 25 covers the side walls and bottom wall of the first trenches 241, and does not fill the first trenches 241; the spacer layer 25 covers the side walls and bottom wall of the second trenches 242, and does not fill the second trenches 242. By adjusting the thickness of the spacer layer 25, the widths of the main overlay marks and the dummy overlay marks subsequently formed can be controlled.

Figure 2D:
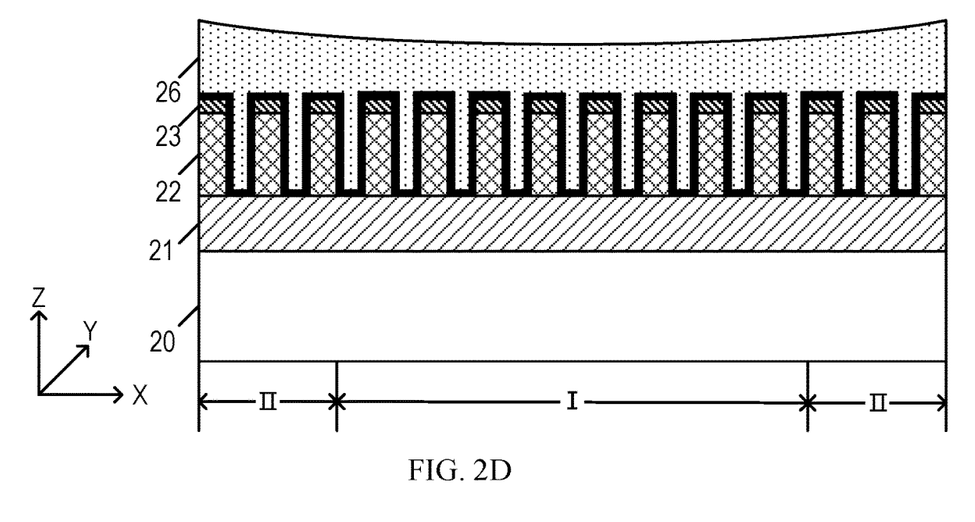
FIG. 2D is a fourth schematic diagram of main process sections during the formation of overlay marks according to specific embodiments of the present application.

Step S14, the first trenches 241 and the second trenches 242 are backfilled to form a second mask layer 26, as shown in FIG. 2D.

In an exemplary embodiment of the present application, the step of forming the second mask layer 26 includes:

the first trenches 241 and the second trenches 242 are backfilled to form the second mask layer 26, the second mask layer fills the first trenches 241 and the second trenches 242 and covers the spacer layer 25 on the top surface of the first mask layer 22, a thickness of the second mask layer 26 in the first pattern region is less than a thickness of the second mask layer 26 in the second pattern regions.

Specifically, the first trenches 241 and the second trenches 242 are backfilled to form the second mask layer 26. The second mask layer 26 fills the first trenches 241 and the second trenches 242 and covers the spacer layer 25 on the top surface of the auxiliary mask layer 23. By providing the second pattern regions with the second trenches 242, even in the process of filling the second mask layer 26, the thickness difference of the second mask layer 26 due to the structure density effect can be pulled outward to reduce the thickness difference of the second mask layer 26 in the first pattern region, so that the thickness of the second mask layer 26 in the first pattern region is less than the thickness of the second mask layer 26 in the second pattern regions to ensure that complete main overlay marks can be formed later. The material of the second mask layer 26 may be the same as the material of the first mask layer 22, for example, both are hard mask materials, such as organic carbon. In other specific embodiments, those skilled in the art may also set the material of the second mask layer 26 to be different from the material of the first mask layer 22 according to actual requirements.

Figure 2E:
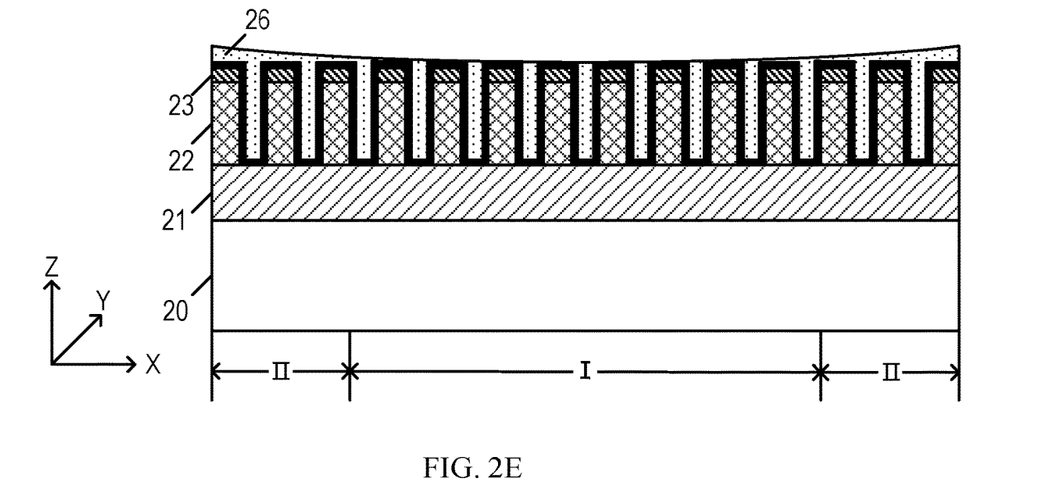
FIG. 2E is a fifth schematic diagram of main process sections during the formation of overlay marks according to specific embodiments of the present application.
Figure 2F:
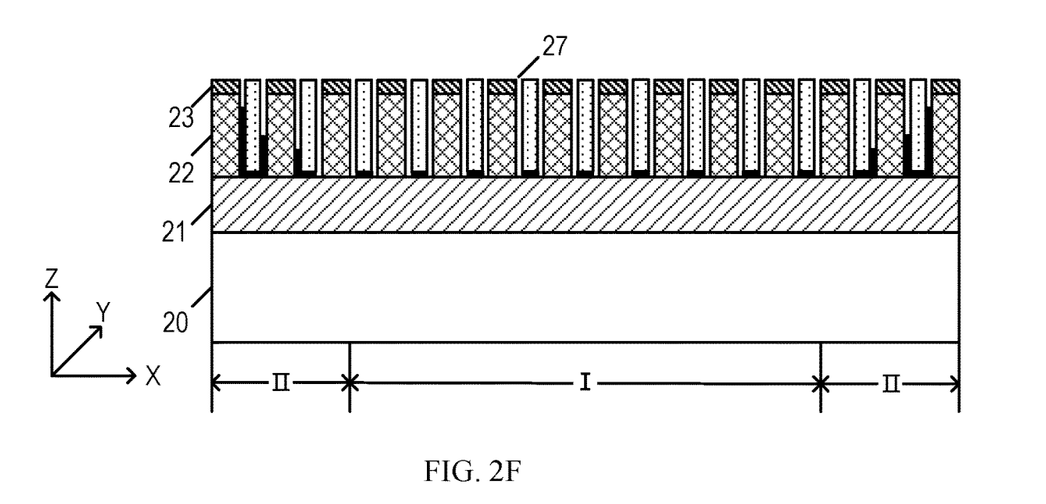
FIG. 2F is a sixth schematic diagram of main process sections during the formation of overlay marks according to specific embodiments of the present application.

Step S15, the spacer layer 25 is removed to form etching windows 27 between the first mask layer 22 and the second mask layer 26, as shown in FIG. 2F.

Specifically, after the second mask layer 26 is formed, the second mask layer 26 is flattened by a chemical mechanical polishing process, using the spacer layer 25 as a polishing stop layer. Due to the structure density effect, after polishing, the spacer layer 25 in the first pattern region can be completely exposed, and because the second mask layer 26 in the second pattern regions is relatively thick, the spacer layer 25 in the second pattern regions cannot be completely exposed, as shown in FIG. 2E. Afterwards, the spacer layer 25 is removed by dry or wet etching. The spacer layer 25 on the side walls of the first trenches 241 can be completely and fully removed, while the spacer layer 25 on the side walls of the second trenches 242 cannot be fully removed, so that a part of the spacer layer 25 remains on the side walls of the second trenches 242, as shown in FIG. 2F.

Step S16, the mark layer 21 is etched along the etching windows 27 to form main overlay marks in the first mark region I and dummy overlay marks in the second mark regions II.

Figure 2G:
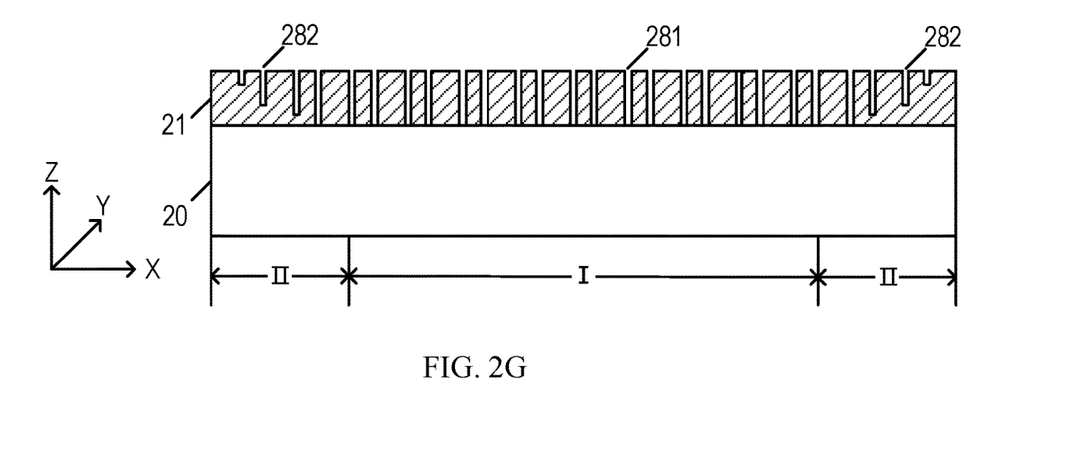
FIG. 2G is a seventh schematic diagram of main process sections during the formation of overlay marks according to specific embodiments of the present application.

Specifically, the mark layer 21 is etched along the etching windows 27 to form main overlay mark grooves 281 in the first mark region I and dummy overlay mark grooves 282 in the second mark regions II at the same time. All the main overlay mark grooves 281 in the first mark region I penetrate the mark layer 21 in the direction perpendicular to the substrate 20, and there are dummy overlay mark grooves 282 that do not penetrate the mark layer 21 in the second mark regions II, as shown in FIG. 2G. After that, the main overlay mark grooves 281 are filled with a mark material to form the main overlay marks; and the dummy overlay mark grooves 282 are filled with the mark material to form dummy overlay marks. The mark material may be, but is not limited to, a metal material. The material of the mark layer 21 may be an insulating dielectric material.

In an exemplary embodiment of the present application, the feature size of the dummy overlay marks is less than or equal to the feature size of the main overlay marks.

Specifically, by limiting the feature size of the dummy overlay marks to be less than or equal to the feature size of the main overlay marks, the dummy overlay marks do not affect the alignment of the main overlay marks during overlay alignment.

In an exemplary embodiment of the present application, the second mark regions II are distributed around the periphery of the first mark region I;

The second pattern regions are distributed around the periphery of the first pattern region.

In this specific embodiment, the second mark regions II are distributed around the periphery of the first mark region I as an example for description, so as to fully reduce the influence of the structure density effect on each angle of the main overlay marks. In other specific embodiments, those skilled in the art may also set the second mark regions II on one or more sides of the first mark region I according to actual requirements. More sides refer to two sides or more.

In an exemplary embodiment of the present application, the main overlay marks are bar patterns extending in a first direction, the plurality of main overlay marks are arranged in parallel along a second direction perpendicular to the first direction, and both the first direction and the second direction are parallel to the substrate;

The dummy overlay marks are frame patterns surrounding the first mark region, and the plurality of dummy overlay marks are sequentially nested along a direction of the first mark region to the second mark regions.

Figure 2H:
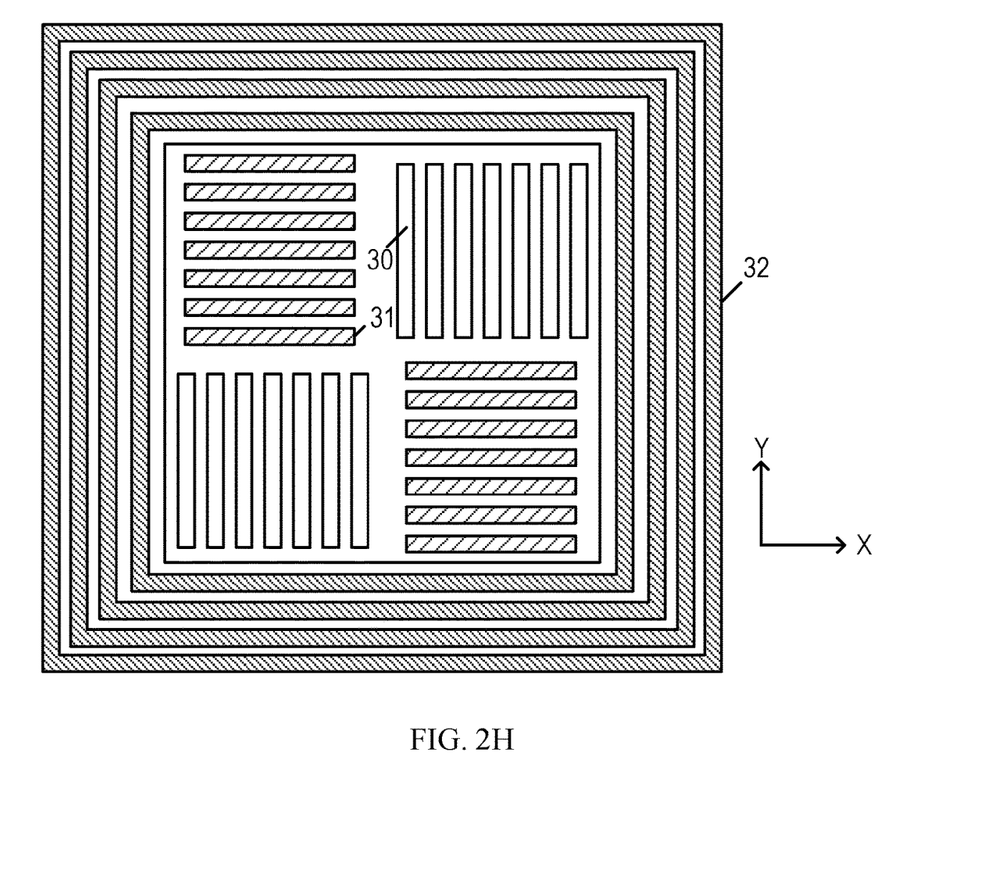
FIG. 2H is an eighth schematic diagram of main process sections during the formation of overlay marks according to specific embodiments of the present application.

FIG. 2H is an overlooked schematic structure diagram of a first kind of overlay marks formed in this embodiment. For example, as shown in FIG. 2H, the main overlay marks 30 of the current layer are surrounded by the dummy overlay marks 32 of the current layer. The main overlay marks 30 of the current layer are bar patterns extending in the Y-axis direction, and the plurality of main overlay marks 30 of the current layer are arranged in parallel along the X-axis direction. The dummy overlay marks 32 of the current layer are frame patterns, and the plurality of dummy overlay marks 32 of the current layer are sequentially nested along a direction in which the main overlay marks 30 of the current layer point to the dummy overlay marks 32 of the current layer. During overlay alignment, the main overlay marks 30 of the current layer are aligned with the main overlay marks 31 of the previous layer.

In an exemplary embodiment of the present application, the main overlay marks are bar patterns extending in a first direction, the plurality of main overlay marks are arranged in parallel along a second direction perpendicular to the first direction, and both the first direction and the second direction are parallel to the substrate;

The dummy overlay marks include first dummy patterns and second dummy patterns, the plurality of first dummy patterns are located at two opposite ends of the main overlay marks in the second direction and extend in the first direction, and the plurality of second dummy patterns are located at two opposite ends of the main overlay marks in the first direction and extend in the second direction.

Figure 2I:
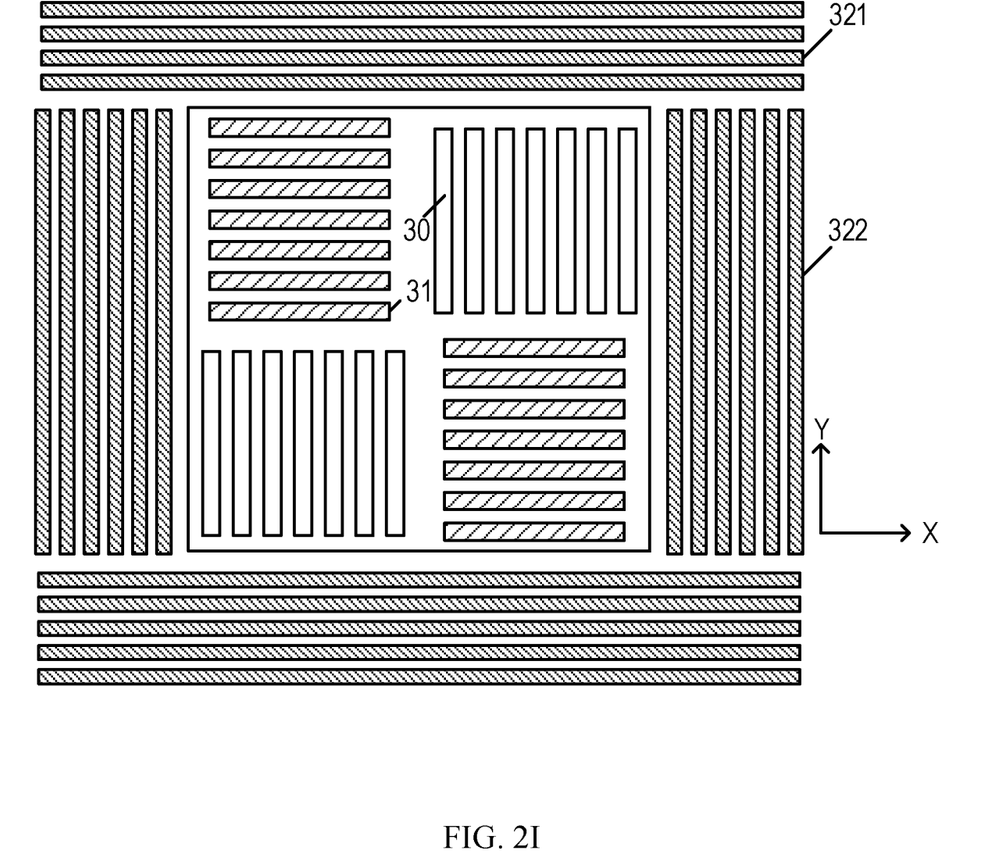
FIG. 2I is a ninth schematic diagram of main process sections during the formation of overlay marks according to specific embodiments of the present application.

FIG. 2H is an overlooked schematic structure diagram of a second kind of overlay marks formed in this embodiment. For example, as shown in FIG. 2I, the main overlay marks 30 of the current layer are surrounded by the dummy overlay marks of the current layer. The main overlay marks 30 of the current layer are bar patterns extending in the Y-axis direction, and the plurality of main overlay marks 30 of the current layer are arranged in parallel along the X-axis direction. The dummy overlay marks of the current layer include first dummy patterns 321 and second dummy patterns 322. The first dummy patterns 321 are distributed at two opposite ends of the main overlay marks 30 in the Y-axis direction and extend in the X-axis direction; and the second dummy patterns 322 are distributed at two opposite ends of the main overlay marks 30 in the X-axis direction and extend in the Y-axis direction. During overlay alignment, the main overlay marks 30 of the current layer are aligned with the main overlay marks 31 of the previous layer.

In an exemplary embodiment of the present application, the main overlay marks are bar patterns extending in a first direction, the plurality of main overlay marks are arranged in parallel along a second direction perpendicular to the first direction, and both the first direction and the second direction are parallel to the substrate;

The dummy overlay marks include a plurality of third dummy patterns, and the plurality of third dummy patterns are arranged in a frame shape around the periphery of the first mark region.

Figure 2J:
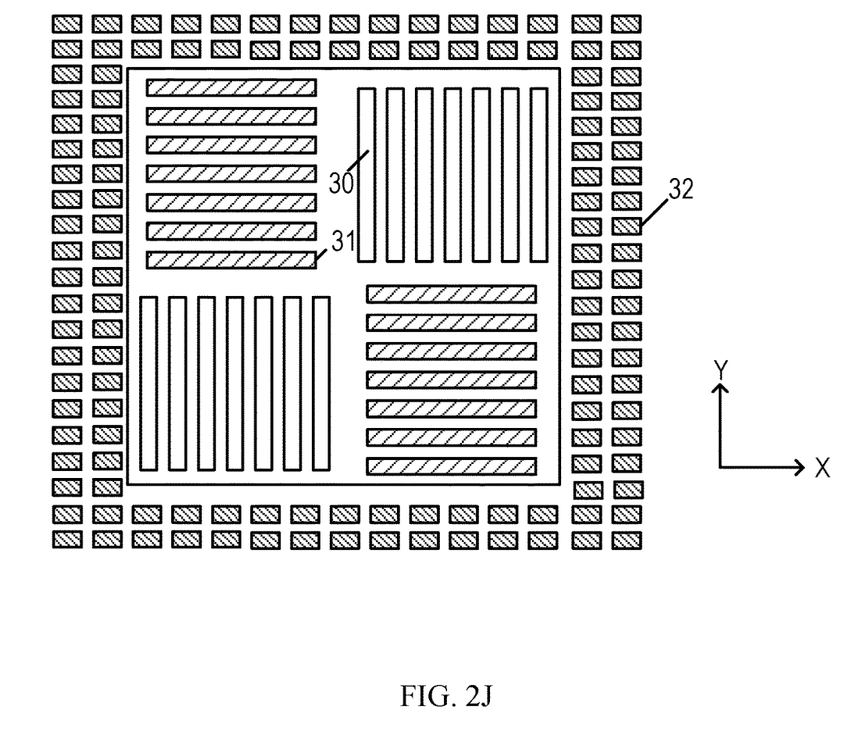
FIG. 2J is a tenth schematic diagram of main process sections during the formation of overlay marks according to specific embodiments of the present application.

FIG. 2J is an overlooked schematic structure diagram of a third kind of overlay marks formed in this embodiment. For example, as shown in FIG. 2J, the main overlay marks 30 of the current layer are surrounded by the dummy overlay marks of the current layer. The main overlay marks 30 of the current layer are bar patterns extending in the Y-axis direction, and the plurality of main overlay marks 30 of the current layer are arranged in parallel along the X-axis direction. The dummy overlay marks of the current layer include a plurality of third dummy patterns 32, and the plurality of third dummy patterns are distributed around the periphery of the main overlay marks 30 of the current layer and form a frame-like structure. During overlay alignment, the main overlay marks 30 of the current layer are aligned with the main overlay marks 31 of the previous layer.

This specific embodiment is described, taking the same structure and size of the plurality of third dummy patterns in the dummy overlay marks. In other specific embodiments, those skilled in the art may set the structure and/or size of the plurality of third dummy patterns to be different according to actual requirements.

Figure 3:
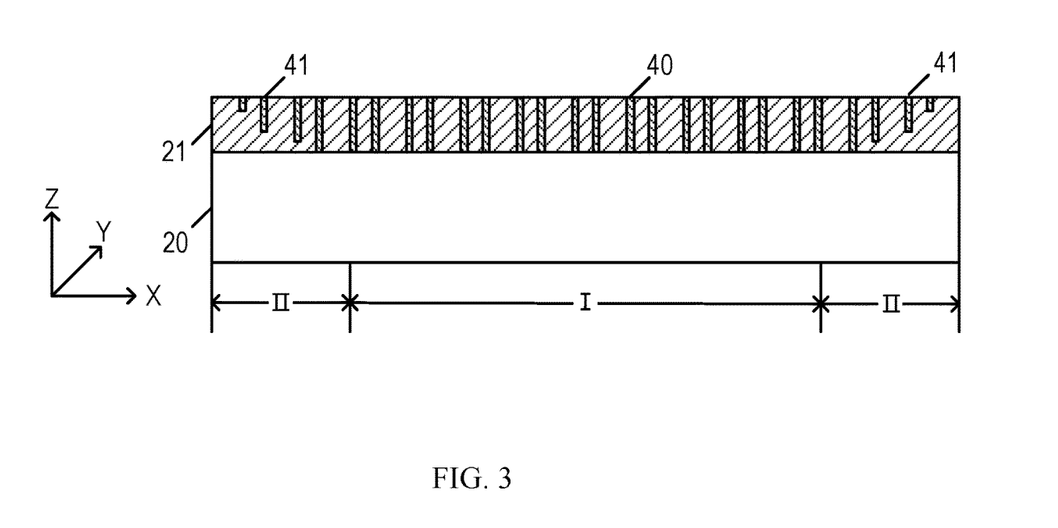
FIG. 3 is a schematic cross-sectional view of a semiconductor structure according to a specific embodiment of the present application.

Moreover, this specific embodiment further provides a semiconductor structure. FIG. 3 is a schematic cross-sectional view of a semiconductor structure according to a specific embodiment of the present application. The semiconductor structure provided by this embodiment may be formed by the method shown in FIGS. 1 and 2A-2J. As shown in FIG. 3, the semiconductor structure provided by this embodiment includes:

a substrate 20; and
a mark layer 21 located on the substrate 20 and including a first mark region I and second mark regions II at ends of the first mark region I, the first mark region I having main overlay marks 40, the second mark regions II having dummy overlay marks 41.

In an exemplary embodiment of the present application, the second mark regions II are distributed around the periphery of the first mark region I.

In an exemplary embodiment of the present application, the main overlay marks 40 are bar patterns extending in a first direction, the plurality of main overlay marks 40 are arranged in parallel along a second direction perpendicular to the first direction, and both the first direction and the second direction are parallel to the substrate;

The dummy overlay marks 41 are frame patterns surrounding the first mark region, and the plurality of dummy overlay marks 41 are sequentially nested along a direction of the first mark region to the second mark regions.

In an exemplary embodiment of the present application, the main overlay marks 40 are bar patterns extending in a first direction, the plurality of main overlay marks 40 are arranged in parallel along a second direction perpendicular to the first direction, and both the first direction and the second direction are parallel to the substrate;

The dummy overlay marks 41 include first dummy patterns and second dummy patterns, the plurality of first dummy patterns are located at two opposite ends of the main overlay marks 40 in the second direction and extend in the first direction, and the plurality of second dummy patterns are located at two opposite ends of the main overlay marks 40 in the first direction and extend in the second direction.

In an exemplary embodiment of the present application, the main overlay marks 40 are bar patterns extending in a first direction, the plurality of main overlay marks 40 are arranged in parallel along a second direction perpendicular to the first direction, and both the first direction and the second direction are parallel to the substrate;

The dummy overlay marks 41 include a plurality of third dummy patterns, and the plurality of third dummy patterns are arranged in a frame shape around the periphery of the first mark region I.

In an exemplary embodiment of the present application, the main overlay marks 40 penetrate the mark layer 21;

The dummy overlay marks 41 penetrate or do not penetrate the mark layer 21.

In an exemplary embodiment of the present application, in a direction of the first mark region I to the second mark regions II, a width of the second mark regions II is less than a width of the first mark region I.

According to the method for forming overlay marks and the semiconductor structure provided by the specific embodiments, a mark layer for forming overlay marks is divided into a first mark region and second mark regions at ends of the first mark region, main overlay marks are formed in the first mark region, and dummy overlay marks are formed in the second mark regions, so that the height difference of the second mask layer due to the structure density effect during the formation of overlay marks is pulled outward to improve the evenness of the thickness of the second mask layer filled in the first mark region, thereby ensuring that intact main overlay marks completely penetrating the mark layer are formed in the mark layer, and ensuring smooth progress of the semiconductor manufacturing process.

Described above are merely preferred embodiments of the present application. It should be pointed out that many improvements and modifications may also be made by those of ordinary skill in the art without departing from the principle of the present application, and these improvements and modifications shall fall into the protection scope of the present application.

What is claimed is:

1. A method for forming overlay marks, comprising:
providing a substrate, a surface of the substrate having a mark layer and a first mask layer, the first mask layer covering a surface of the mark layer, the mark layer comprising a first mark region and second mark regions at ends of the first mark region;
patterning the first mask layer to form a first pattern region and second pattern regions in the first mask layer, the second pattern regions being at ends of the first pattern region, the first pattern region having a plurality of first trenches, the second pattern region having a plurality of second trenches, the first mark region corresponding to the first pattern region, the second mark regions corresponding to the second pattern regions;
forming a spacer layer covering at least side walls of the first trenches and side walls of the second trenches;
backfilling the first trenches and the second trenches to form a second mask layer;
removing the spacer layer on the side walls of the first trenches completely, and removing the spacer layer on the side walls of the second trenches partially, to form etching windows between the first mask layer and the second mask layer; and
etching the mark layer along the etching windows to form main overlay mark grooves in the first mark region and dummy overlay mark grooves in the second mark regions simultaneously, wherein the main overlay mark grooves in the first mark region penetrate the mark layer in the direction perpendicular to the substrate, and the dummy overlay mark grooves do not penetrate the mark layer in the second mark regions;
filling the main overlay mark grooves with a mark material to form main overlay marks and filling the dummy overlay mark grooves with the mark material to form dummy overlay marks; wherein feature size of the dummy overlay mark is less than or equal to the feature size of the main overlay mark.

2. The method for forming overlay marks according to claim 1, wherein the step of forming a spacer layer covering at least side walls of the first trenches and side walls of the second trenches comprises:
depositing a spacer material to form the spacer layer covering the side walls and bottom wall of the first trenches, the side walls and bottom wall of the second trenches, and a top surface of the first mask layer.

3. The method for forming overlay marks according to claim 2, wherein the step of forming a second mask layer comprises:

backfilling the first trenches and the second trenches to form the second mask layer, wherein, the second mask layer fills the first trenches and the second trenches and covers the spacer layer on the top surface of the first mask layer, and a thickness of the second mask layer in the first pattern region is less than a thickness of the second mask layer in the second pattern regions.

4. The method for forming overlay marks according to claim 1, wherein the second mark regions are distributed around periphery of the first mark region; and the second pattern regions are distributed around periphery of the first pattern region.

5. The method for forming overlay marks according to claim 1, wherein the main overlay marks are bar patterns extending in a first direction, a plurality of the main overlay marks are arranged in parallel along a second direction perpendicular to the first direction, and both the first direction and the second direction are parallel to the substrate; and the dummy overlay marks are frame patterns surrounding the first mark region, and a plurality of the dummy overlay marks are sequentially nested along a direction of the first mark region to the second mark regions.

6. The method for forming overlay marks according to claim 1, wherein the main overlay marks are bar patterns extending in a first direction, a plurality of the main overlay marks are arranged in parallel along a second direction perpendicular to the first direction, and both the first direction and the second direction are parallel to the substrate; and the dummy overlay marks comprise first dummy patterns and second dummy patterns, a plurality of the first dummy patterns are disposed at two opposite ends of the main overlay marks in the second direction and extend in the first direction, and a plurality of the second dummy patterns are located at two opposite ends of the main overlay marks in the first direction and extend in the second direction.

7. The method for forming overlay marks according to claim 1, wherein the main overlay marks are bar patterns extending in a first direction, a plurality of main overlay marks are arranged in parallel along a second direction perpendicular to the first direction, and both the first direction and the second direction are parallel to the substrate; and the dummy overlay marks comprise a plurality of third dummy patterns, and the plurality of third dummy patterns are arranged in a frame shape around periphery of the first mark region.

8. The method for forming overlay marks according to claim 1, wherein a feature size of the dummy overlay marks is less than or equal to a feature size of the main overlay marks.

9. A semiconductor structure, comprising:
a substrate; and
a mark layer located on the substrate and comprising a first mark region and second mark regions, the second mark regions disposed at ends of the first mark region, the first mark region having main overlay marks, the second mark regions having dummy overlay marks;

wherein the main overlay marks penetrate the mark layer and the dummy overlay marks do not penetrate the mark layer; and feature size of the dummy overlay mark is less than or equal to the feature size of the main overlay mark.

10. The semiconductor structure according to claim 9, wherein the second mark regions are distributed around periphery of the first mark region.

11. The semiconductor structure according to claim 9, wherein the main overlay marks are bar patterns extending in a first direction, a plurality of main overlay marks are arranged in parallel along a second direction perpendicular to the first direction, and both the first direction and the second direction are parallel to the substrate; and the dummy overlay marks are frame patterns surrounding the first mark region, and a plurality of dummy overlay marks are sequentially nested along a direction of the first mark region to the second mark regions.

12. The semiconductor structure according to claim 9, wherein the main overlay marks are bar patterns extending in a first direction, a plurality of main overlay marks are arranged in parallel along a second direction perpendicular to the first direction, and both the first direction and the second direction are parallel to the substrate; and the dummy overlay marks comprise first dummy patterns and second dummy patterns, a plurality of first dummy patterns are located at two opposite ends of the main overlay marks in the second direction and extend in the first direction, and a plurality of second dummy patterns are located at two opposite ends of the main overlay marks in the first direction and extend in the second direction.

13. The semiconductor structure according to claim 9, wherein the main overlay marks are bar patterns extending in a first direction, a plurality of main overlay marks are arranged in parallel along a second direction perpendicular to the first direction, and both the first direction and the second direction are parallel to the substrate; and the dummy overlay marks comprise a plurality of third dummy patterns, and the plurality of third dummy patterns are arranged in a frame shape around periphery of the first mark region.

14. The semiconductor structure according to claim 9, wherein in a direction of the first mark region to the second mark regions, a width of the second mark regions is less than a width of the first mark region.

* * * * *